US012191328B2

(12) United States Patent
Fang et al.

(10) Patent No.: US 12,191,328 B2
(45) Date of Patent: Jan. 7, 2025

(54) PHOTODETECTOR WITH REDUCED DARK CURRENT SENSITIVITY AND METHODS OF FORMING THE SAME

(71) Applicant: Taiwan Semiconductor Manufacturing Company Limited, Hsinchu (TW)

(72) Inventors: Yeh-Hsun Fang, Taipei (TW); Zhi-Wei Zhuang, Hsinchu (TW); Li-Hsin Chu, New Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 499 days.

(21) Appl. No.: 17/458,676

(22) Filed: Aug. 27, 2021

(65) Prior Publication Data

US 2023/0066466 A1 Mar. 2, 2023

(51) Int. Cl.
*H01L 27/146* (2006.01)
*G01J 1/44* (2006.01)
*H01L 23/00* (2006.01)

(52) U.S. Cl.
CPC .......... *H01L 27/1461* (2013.01); *G01J 1/44* (2013.01); *H01L 24/08* (2013.01); *H01L 24/80* (2013.01); *H01L 27/14621* (2013.01); *H01L 27/14627* (2013.01); *H01L 27/14634* (2013.01); *H01L 27/14636* (2013.01); *H01L 27/1469* (2013.01); *H01L 2224/08145* (2013.01); *H01L 2224/80895* (2013.01); *H01L 2224/80896* (2013.01)

(58) Field of Classification Search
CPC ..... H01L 27/1461; H01L 24/08; H01L 24/80; H01L 27/14621; H01L 27/14627; H01L 27/14634; H01L 27/14636; H01L 27/1469; H01L 2224/80895; H01L 2224/80896; G01J 1/44
See application file for complete search history.

(56) References Cited

U.S. PATENT DOCUMENTS

| | | | |
|---|---|---|---|
| 9,748,306 B2* | 8/2017 | Morgan ............ | H01L 27/14683 |
| 2005/0279998 A1* | 12/2005 | Cole ................. | H01L 27/14643 |
| | | | 438/22 |
| 2018/0261636 A1* | 9/2018 | Liu ..................... | H01L 31/1808 |
| 2022/0328556 A1* | 10/2022 | Liu ................... | H01L 27/14603 |
| 2023/0066085 A1* | 3/2023 | Fang ................. | H01L 27/14627 |

OTHER PUBLICATIONS

Aqion Table of diffusion coefficients (Year: 2020).*

* cited by examiner

*Primary Examiner* — Kretelia Graham
*Assistant Examiner* — Jaesun Lee
(74) *Attorney, Agent, or Firm* — The Marbury Law Group, PLLC

(57) ABSTRACT

A method of forming a semiconductor device includes: forming a patterned hard mask layer on a semiconductor substrate; performing a first etching process to form a recess in an exposed portion of the semiconductor substrate, using a first etchant that includes a first halogen species; performing a second etching process using a second etchant that includes a second halogen species, such that the second halogen species forms a barrier layer in the semiconductor substrate, surrounding the recess; and growing a detection region in the recess using an epitaxial growth process. The barrier layer is configured to reduce diffusion of the first halogen species into the detection region.

20 Claims, 9 Drawing Sheets

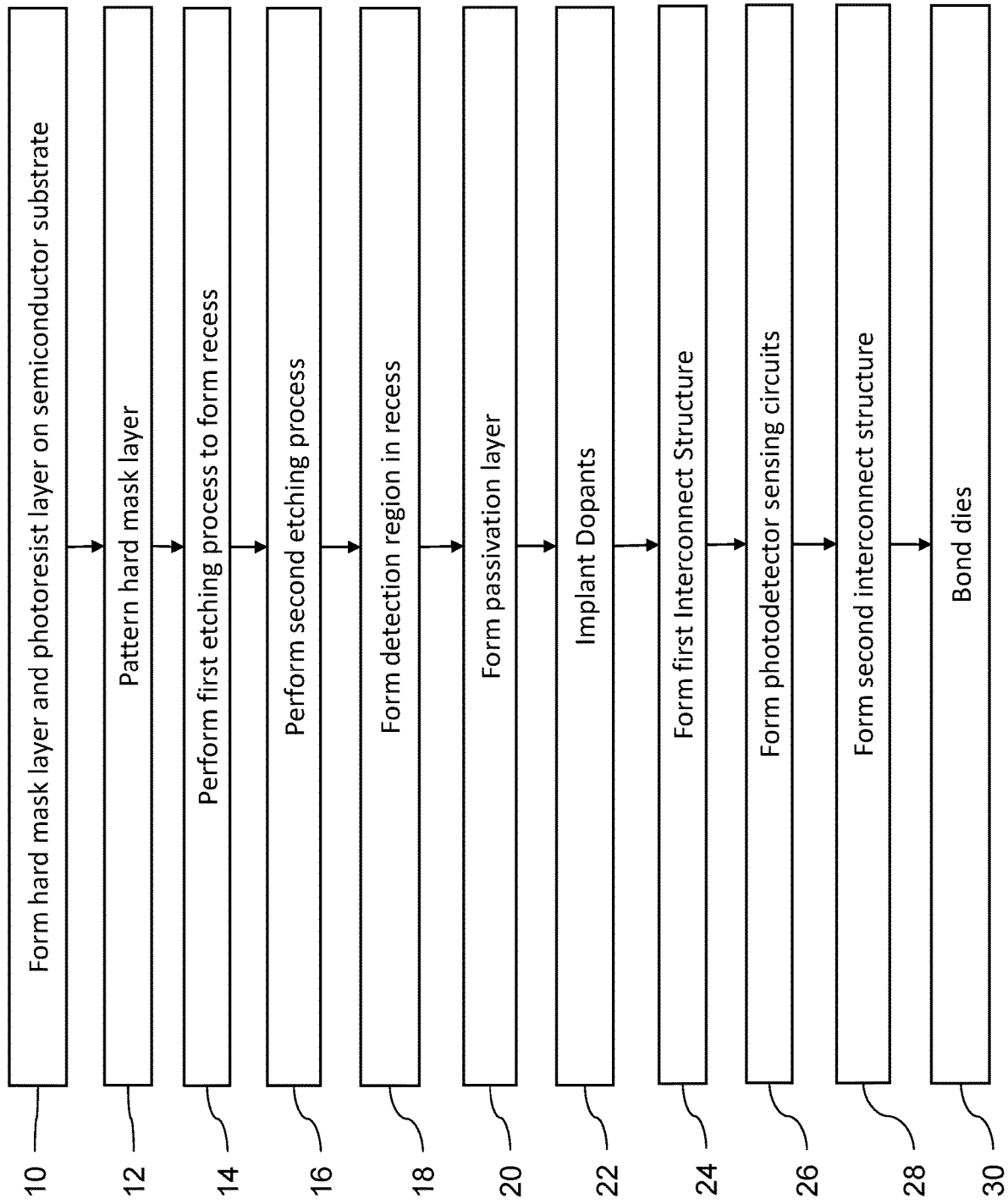

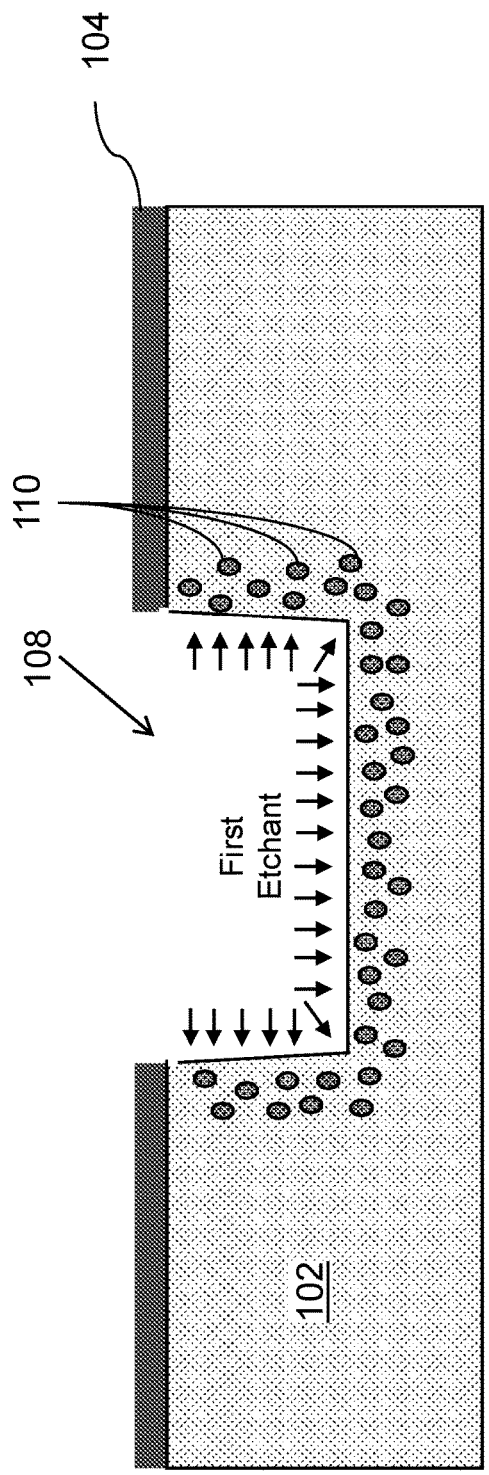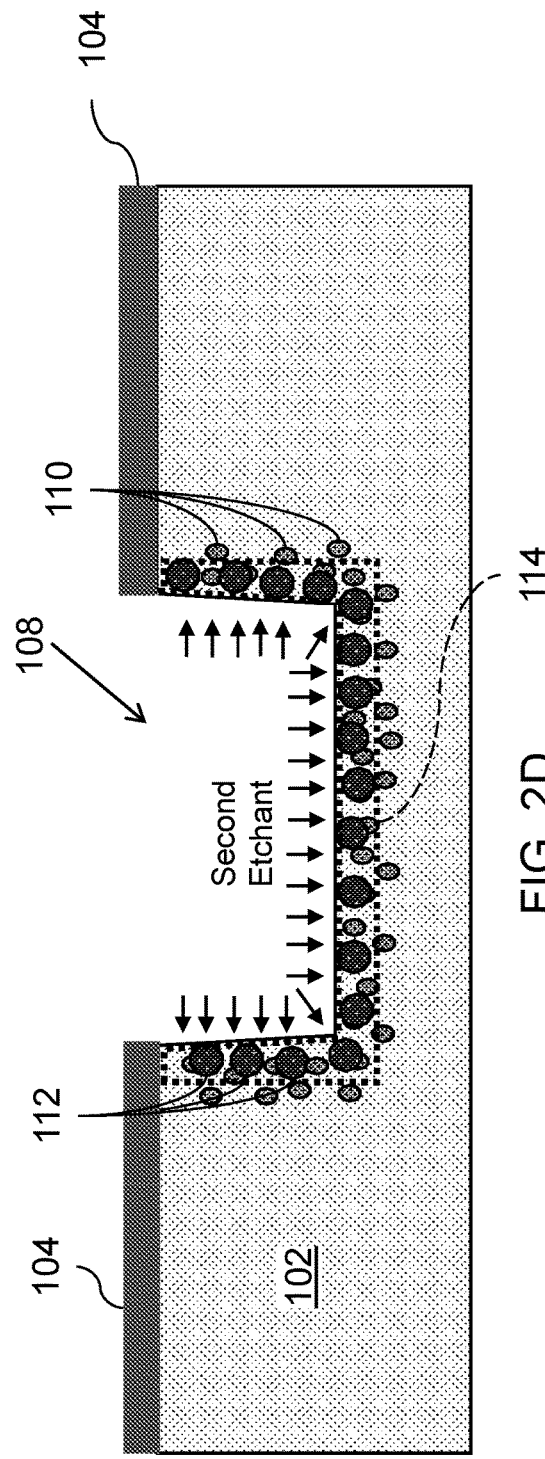

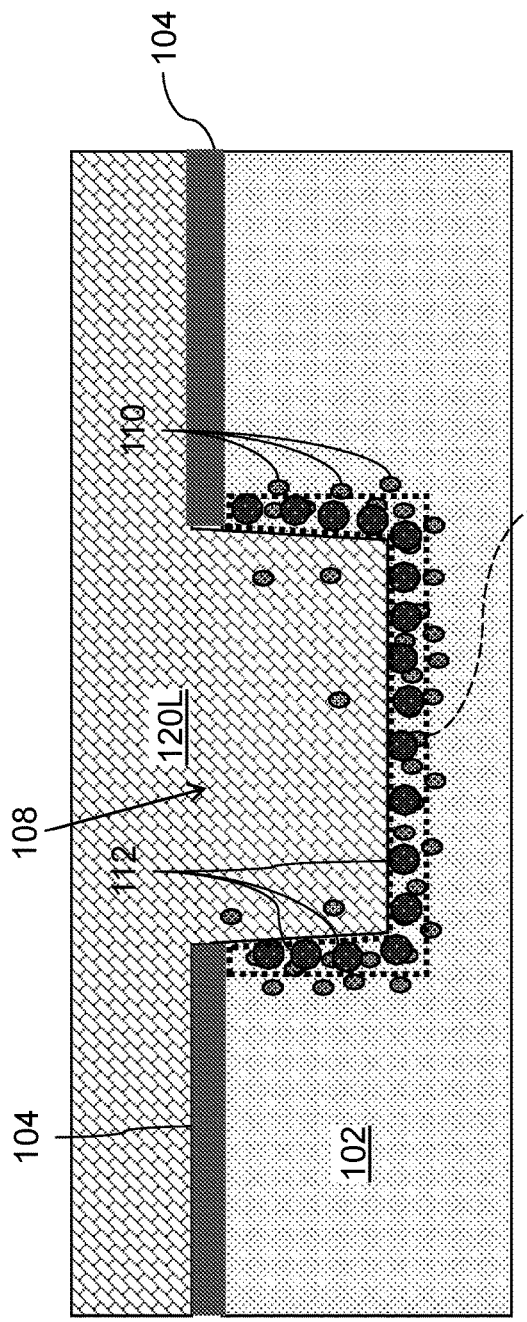
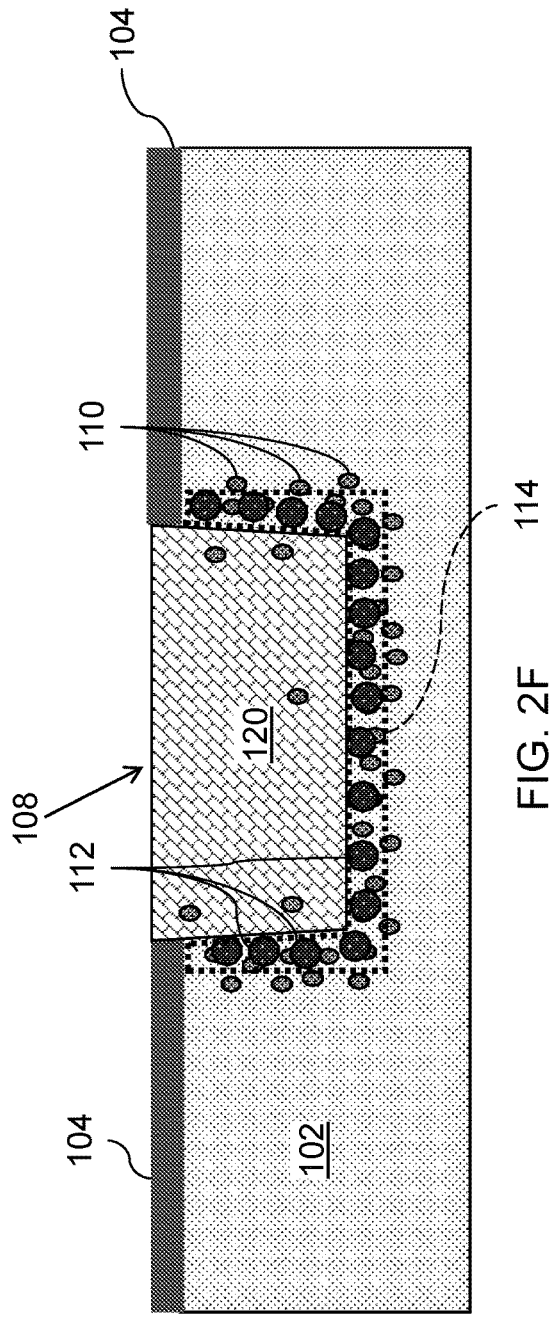
FIG. 2E
FIG. 2F

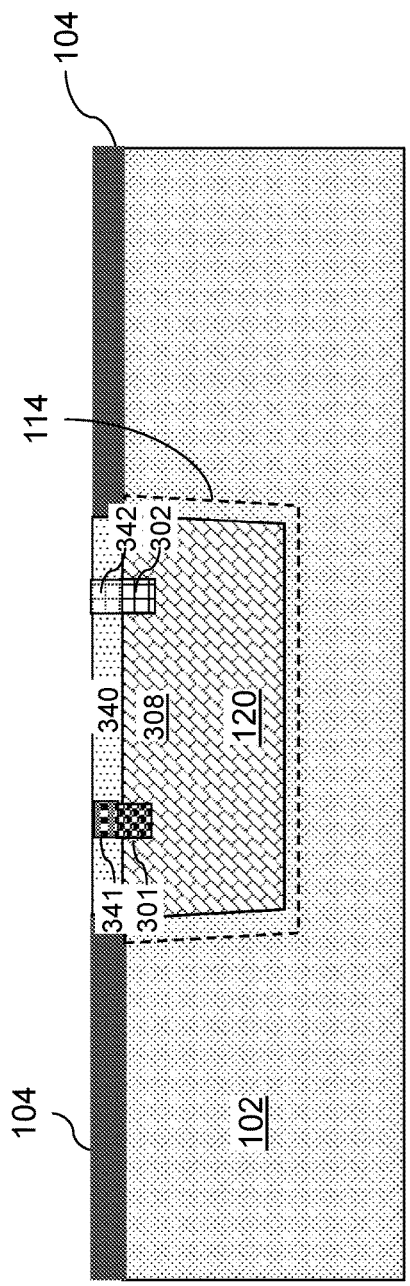
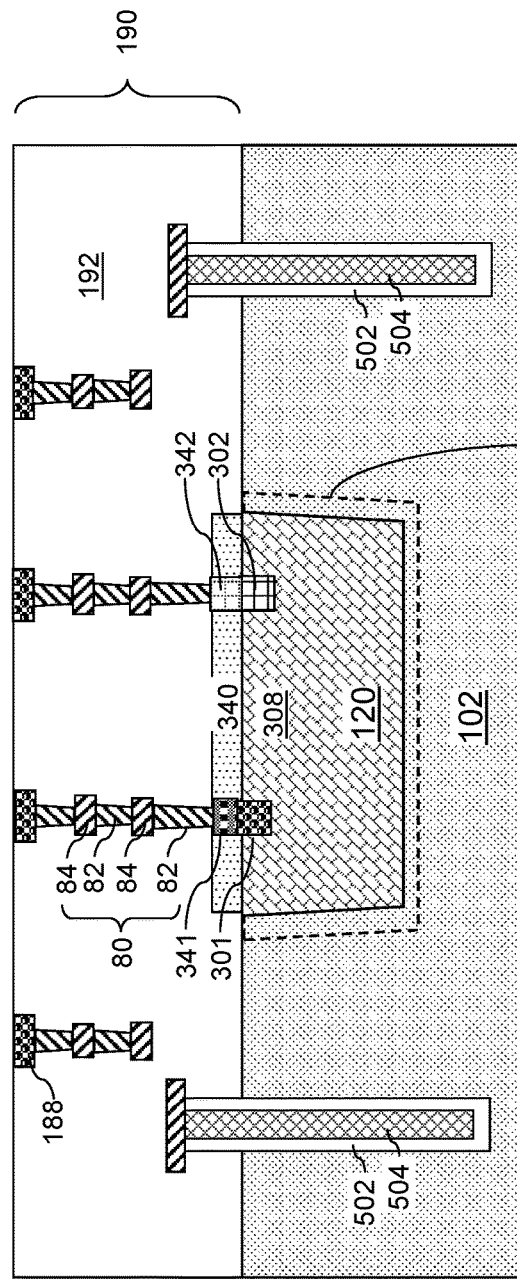
FIG. 2I
FIG. 2J

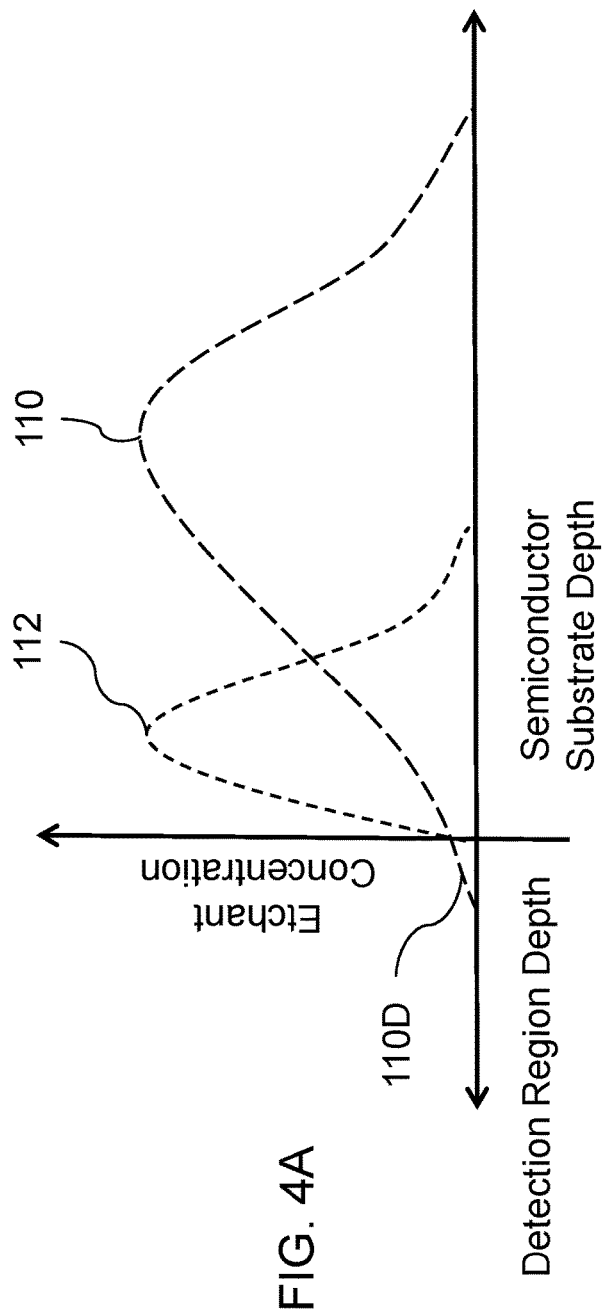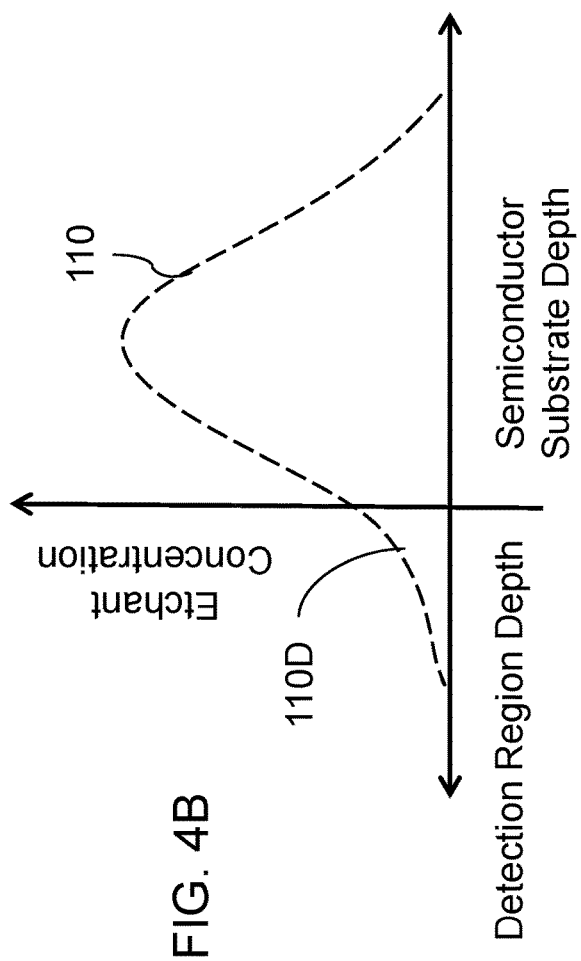

PHOTODETECTOR WITH REDUCED DARK CURRENT SENSITIVITY AND METHODS OF FORMING THE SAME

BACKGROUND

Image sensors capable of sensing images in infrared light, especially short wave infrared light, have a wide variety of applications including optical communications (both fiber and free space), laser detecting and ranging (LADAR/LIDAR), ice detection (as on roads and aircraft), and pharmaceutical manufacturing. Such image sensors may also be used in art conservation, detection of tumors, astronomy, imaging through smoke and clouds, pollution detection, infrared microscopy, infrared spectroscopy and integrated circuit fabrication. Infrared image sensors may also be used in night vision and for three dimensional laser detection and ranging (3-D LADAR).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow diagram illustrating the operations of a method of forming a semiconductor device including epitaxial detection regions, according to various embodiments of the present disclosure.

FIGS. 2A-2K are cross-sectional views illustrating the operations of the method of FIG. 1.

FIGS. 4A and 4B are graphs showing halogen species etchant concentrations, according to various embodiments of the present disclosure.

DETAILED DESCRIPTION

Figure 2A:
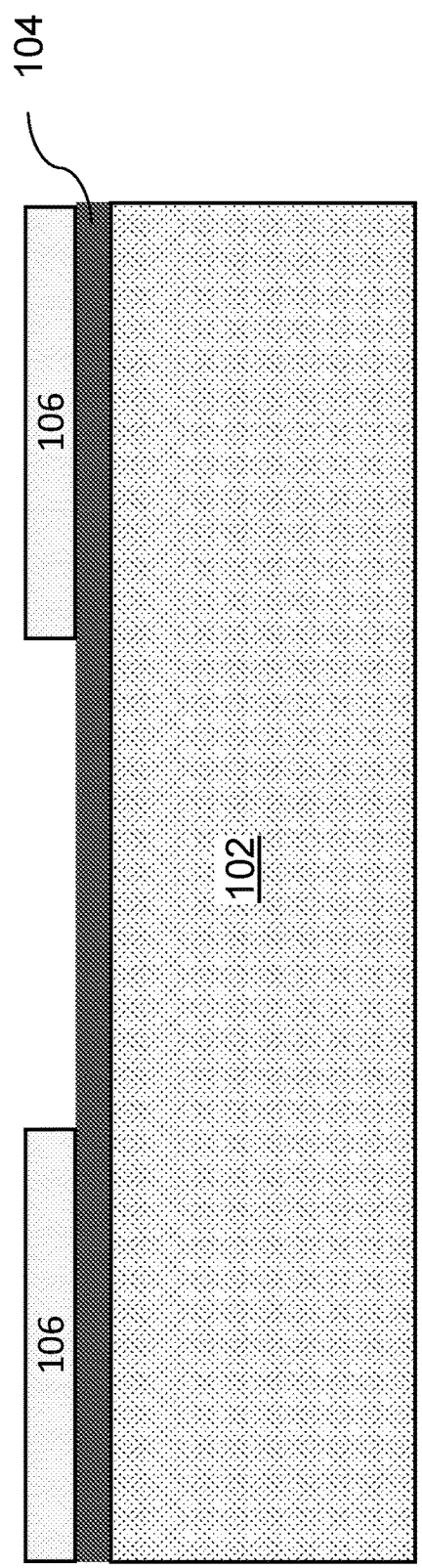

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to photodetector sensor devices with reduced dark current sensitivity. To improve dark current sensitivity, photodetector sensors may be formed with a germanium (Ge) detection region disposed over a semiconductor substrate. However, such a configuration may limit the number of Ge layers that may be integrated into a device, which may reduce device resolution and/or increase device size and complexity. By recessing the semiconductor substrate and depositing the Ge material therein to form a detection region, a photodetector device with improved device resolution and/or increased device size and complexity characteristics may be formed. The recess in the semiconductor substrate may be formed using a first etchant gas that includes a first halogen series. However, such an etchant gas may leave the first halogen series implanted in the semiconductor substrate. The implanted first halogen series may diffuse into the subsequently formed Ge material in the detection region. In order to mitigate against the diffusion of the first halogen series, a second etch process using a second etchant gas including a second halogen series may be performed. The resulting implanted second halogen series may act as a barrier layer to the implanted first halogen series, thus preventing the diffusion of the first halogen series into the subsequently formed detection region.

A photodiode may be used to detect optical signals and convert the optical signals to electrical signals that may be further processed by another circuitry. Photodiodes may be used in consumer electronics products, image sensors, data communications, time-of-flight (TOF) applications, medical devices, and many other suitable applications. The photodiodes convert the detected light into electrical charges. Each photodiode may include multiple gates that are controlled to collect the electrical charges.

A typical image sensor comprises a two-dimensional array of photodetectors (called a focal plane array) in combination with a readout integrated circuit (ROIC). The photodetectors are sensitive to incoming radiation. The ROIC quantitatively evaluates the outputs from the photodetectors and processes them into an image. Common image sensing device defects include optical cross-talk, electrical cross-talk, and dark current. These defects become more impactful as the image pixel sizes and the spacing between neighboring image pixels continues to shrink. Optical cross-talk refers to photon interference from neighboring pixels that degrades the light-sensing reliability and accuracy of the pixels. Dark current may be defined as the existence of pixel current when no actual illumination is present. In other words, the dark current is the current that flows through the photodiode despite no photons entering the photodiode. White pixels occur where an excessive amount of current leakage causes an abnormally high signal from the pixels.

In photo sensors, such as TOF sensors that include a Ge layer as an image sensor material, excessive dark current may be generated if the Ge layer is not properly formed. For example, defects in the crystal structure and/or impurities in the Ge layer may increase the potential for dark current.

Germanium is chemically compatible with silicon and optically responsive to radiation in the visible spectrum from blue light to wavelengths of about 1.6 µm. Conventional detectors have relied upon Ge layer formed over a semiconductor substrate. However, such a configuration may limit the number of Ge layers that may be integrated into a device, which may reduce device resolution and/or increase device size and complexity. Accordingly, there is a need for a new method of forming Ge detection regions that are integrated directly into a semiconductor substrate to provide photodetectors that have improved sensitivity, dynamic range, and/or efficiency.

According to various embodiments, FIG. 1 is a flow diagram illustrating the operations of a method of forming a photo detector including Ge-based detection regions that are epitaxially grown directly in recesses formed in a semiconductor substrate, according to various embodiments of the present disclosure. FIGS. 2A-2K are cross-sectional views illustrating the various intermediary structures that may be formed through the operations of the method of FIG. 1.

Referring to FIGS. 1 and 2A, in operation 10, the method may include forming a hard mask layer 104 on a semiconductor substrate 102, which may also be referred to herein as a "first semiconductor substrate". The semiconductor substrate 102 may be a silicon substrate; however, any suitable semiconductor material may be used. The semiconductor substrate 102 may include doped regions (not shown) including P-type or N-type dopants implanted therein. The doped regions may form elements of photodiodes, in some embodiments. The semiconductor substrate 102 may have a thickness ranging from about 2 µm to about 5 µm, such as about 3 µm, although thicker or thinner dimensions may be used.

The hard mask layer 104 may be an oxide layer, such as a $SiO_2$ layer, formed on an upper surface of the semiconductor substrate 102. However, the present disclosure is not limited to any particular type of hard mask material. Other hard mask materials are within the contemplated scope of disclosure. In various embodiments, the hard mask layer 104 may be formed by oxidizing the surface of the semiconductor substrate 102, or may be formed by depositing a hard mask layer 104 material on the semiconductor substrate 102 using any suitable deposition method. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

A photoresist layer 106 may be deposited over the hard mask layer 104 using any suitable deposition process. The photoresist layer 106 may be patterned, for example, through a photolithographic process to cover portions of the upper surface of the hard mask layer 104 and to expose other portions of the hard mask layer 104. Although not shown, the patterning may expose multiple portions of the hard mask layer 104, and the exposed portions may be arranged in an array.

Figure 2B:
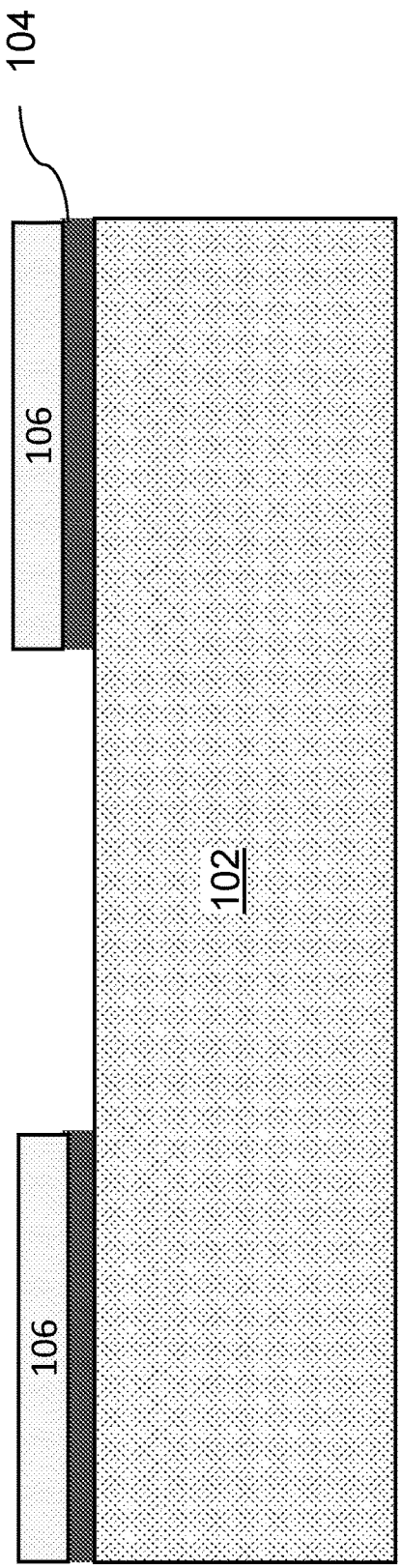

Referring to FIGS. 1 and 2B, in operation 12, the method may include performing a patterning process to pattern the hard mask layer 104, using the photoresist layer 106 as a mask, to expose a portion of the upper surface of the semiconductor substrate 102. Although not shown, the patterning process may expose multiple portions of the semiconductor substrate 102, with the portions being arranged in an array. The patterning process may include any suitable wet or dry etching process to pattern the hard mask layer 104.

Referring to FIGS. 1 and 2C, in operation 14, the method may include performing a first etching process. The first etching process may include etching the semiconductor substrate 102, using the hard mask layer 104 as a mask, to form a recess 108 in the semiconductor substrate 102. Although not shown, an array of recesses 108 may be formed in the semiconductor substrate 102.

The first etching process may include dry etching, wet etching, or combination thereof. In the present embodiment, the first etching process may be a dry etching process, such as reactive ion etching, which utilizes a gaseous first etchant, optionally in combination with oxygen gas ($O_2$) and/or helium gas (He). In various embodiments, the gaseous first etchant may include elements selected from a first halogen species. For example, the halogen species may include six nonmetallic elements that constitute Group 17 (Group VIIa) of the periodic table. The halogen elements include fluorine (F), chlorine (Cl), bromine (Br), iodine (I), astatine (At), and tennessine (Ts). However, the first etchant may preferably include F, Cl, Br, and I as more common etchants. For example, the first etchant may include halogen gasses, such as $F_2$, $Cl_2$, $Br_2$, or $I_2$, or halogen-containing gasses, such as $CHF_4$, $CH_2F_2$, $CH_3F$, $NF_3$, $SiF_4$, $CF_4$, $SF_6F$, $S_2F_2$, $XeF_2$, $CBr_4$, or the like. However, the embodiments disclosed herein are not intended to be limited to these exemplary etchants. Other suitable etchants are within the contemplated scope of disclosure.

The first etching process may be conducted using a pressure ranging from about 1 mT to about 1000 mT, although lesser or greater pressures may be used. The first etching process may be performed using a power ranging from about 50 W to about 1000 W, although less or more power may be used. The first etching process may use a bias voltage ranging from about 100 V to about 500 V, although a lesser or greater bias voltage may be used. The first etching process may use a first etchant gas flow rate ranging from about 10 sccm to about 500 sccm, although a lesser or greater first etchant gas flow rate may be used. The first etching process may use an $O_2$ flow rate ranging from about 0 sccm to about 100 sccm, although a lesser or greater flow rate of $O_2$ may be used. The first etching process may use a He flow rate ranging from about 0 sccm to about 1000 sccm, although a lesser or greater flow rate of He may be used.

In an embodiment, the recess 108 may have substantially vertical sidewalls due to the directional/anisotropic etching. In another embodiment, the sidewalls may be tapered. In addition, first halogen species 110 may remain in the substrate 102, adjacent to the sidewalls and/or the bottom of the recess 108. In various embodiments, the depth of the recess 108 may be in a range from 0.5 micron to 10 microns, such as from 1 micron to 6 microns, although lesser and greater depths may also be used. The lateral dimension of the recess 108 may be in a range from 0.5 micron to 30 microns, such as from 1 micron to 15 microns, although lesser and greater lateral dimensions may also be used.

Referring to FIGS. 1 and 2D, in operation 16, the method may include performing a second etching process. In particular, the second etching process may be a dry etching process, such as reactive ion etching, that utilizes a gaseous second etchant, optionally in combination with $O_2$ and/or He. In various embodiments, the gaseous second etchant may include elements selected from a second halogen species. As noted above, the halogen species may include six nonmetallic elements that constitute Group 17 (Group VIIa) of the periodic table. The halogen elements include fluorine (F), chlorine (Cl), bromine (Br), iodine (I), astatine (At), and tennessine (Ts). However, the second etchant may preferably include F, Cl, Br, and I as more common etchants. For example, the second etchant may include halogen gasses as noted above. However, the embodiments disclosed herein are not intended to be limited to these exemplary etchants. Other suitable etchants are within the contemplated scope of disclosure.

The second etching process may be a surface etching processes that lightly etches the sidewalls and/or the bottom of the recess 108. In particular, the second etching process may not significantly increase the etching depth of the recess 108, e.g., the depth and/or width of the recess 108. For example, the second etching process may increase the etching depth of the recess 108 by an amount of less than about 10%, or less than about 5%. Second halogen species 112 generated from the second etchant during the second etching process may remain in the substrate 102, adjacent to the sidewalls and bottom of the recess 108, after the second etching process is complete.

The second etching process may be conducted using a pressure ranging from about 1 mT to about 1000 mT, although lesser or greater pressures may be used. The second etching process may be performed using a power ranging from about 50 W to about 1000 W, although less or more power may be used. The second etching process may use a bias voltage ranging from about 100 V to about 500 V, although a lesser or greater bias voltage may be used. The second etching process may use a second etchant gas flow rate ranging from about 10 sccm to about 250 sccm, although a lesser or greater second etchant gas flow rate may be used. The second etching process may use an $O_2$ flow rate ranging from about 0 sccm to about 100 sccm, although a lesser or greater flow rate of $O_2$ may be used. The second etching process may use a He flow rate ranging from about 0 sccm to about 1000 sccm, although a lesser or greater flow rate of He may be used.

In various embodiments, the second etching process may be configured such that the second halogen species 112 may be disposed, on average, closer to the sidewalls and bottom of the recess 108 than the first halogen species 110. In other words, the penetration depth of the second halogen species 112 into the substrate 102 (e.g., bottom and/or sidewalls of the recess 108) may be less than a penetration depth of the first halogen species 110. For example, the first etchant and second etchant may be selected such that the second halogen species 112 has a lower diffusion coefficient with respect to silicon than the first halogen species 110. In some embodiments, the second etching process may be conducted at a lower power and/or for a shorter duration than the first etching process. For example, the second etching process may have a lower bias voltage than the first etching process. Accordingly, the second halogen species 112 may effectively form a barrier layer 114 that surrounds the sidewalls and bottom of the recess 108.

According to various embodiments, the first etchant and the second etchant may be selected such that the second halogen species 112 may be larger (e.g., have a larger atomic radius) than the first halogen species 110. For example, in some embodiments, the first halogen species 110 may comprise F and/or Cl, and the second halogen species 112 may comprise Br and/or Ir. In other embodiments, the first halogen species 110 may comprise F, and the second halogen species 112 may comprise Cl and/or Br. For example, the first etchant and the second etchant may be selected such that the halogen atoms generated by the second etchant are larger than the halogen atoms generated by the first etchant. For example, the first etchant may comprise $Cl_2$, or a Cl-containing etchant, and the second etchant may comprise $Br_2$, or a Br-containing etchant, and the first halogen species 110 may include Cl atoms, and the second halogen species 112 may include relatively larger Br atoms. As such, the second halogen species 112 may form the barrier layer 114 surrounding the recess 108.

Referring to FIGS. 1 and 2E-2G, in operation 18, a detection region 120 may be grown in the recess 108. In particular, a germanium-containing layer 120L may be grown on the semiconductor substrate 102 and in the recess 108. The germanium-containing layer 120L may include germanium at an atomic percentage greater than 50%. In one embodiment, the germanium-containing layer 120L may include doped or undoped germanium such that the atomic percentage of germanium is at least 99%, and is essentially free of silicon. In another embodiment, the germanium-containing layer 120L may include a silicon-germanium alloy in which the atomic percentage of germanium is greater than 50%, and the atomic percentage of silicon is less than 50%, such as from 1% to 30%.

The germanium-containing layer 120L may be formed by a selective deposition process or a non-selective deposition process. The selective deposition process or the non-selective deposition process may be an epitaxial deposition process, i.e., a deposition process that provides alignment of crystallographic structure of the deposited germanium-containing material to the crystalline structure at the physically exposed surfaces of the underlying material portions. Thus, at least the portion of the germanium-containing layer 120L that is deposited in the recess 108 may be formed as a single crystal that is epitaxially aligned to the crystalline structure of the semiconductor substrate 102.

The location and/or size of the second halogen species 112 may allow the barrier layer 114 to limit the diffusion of the first halogen species 110 into the germanium-containing layer 120L, as compared to a similar structure that was formed without a second etching process and did not include a barrier layer 114 formed of the second halogen species 112. As such, only a relatively small number of the first halogen species 110D may diffuse into the germanium-containing layer 120L, as shown in FIG. 2E. In other words, the barrier layer 114 reduces diffusion of the first halogen species 110 into the germanium-containing layer 120L from the first semiconductor substrate 102. Further discussion of the properties of the barrier layer 114 are discussed in detail below with respect to FIGS. 4A and 4B.

Excess portions of the germanium-containing layer 120L may be removed from above the horizontal plane including the top surface of the hard mask layer 104, to form the detection region 120 in the recess 108. In one embodiment, a chemical mechanical planarization (CMP) process may be performed to remove portions of the germanium-containing layer 120L located above the horizontal plane including the top surface of the hard mask layer 104. As shown in FIG. 2F, the detection region 120 and hard mask layer 104 may be co-planar.

Figure 2G:
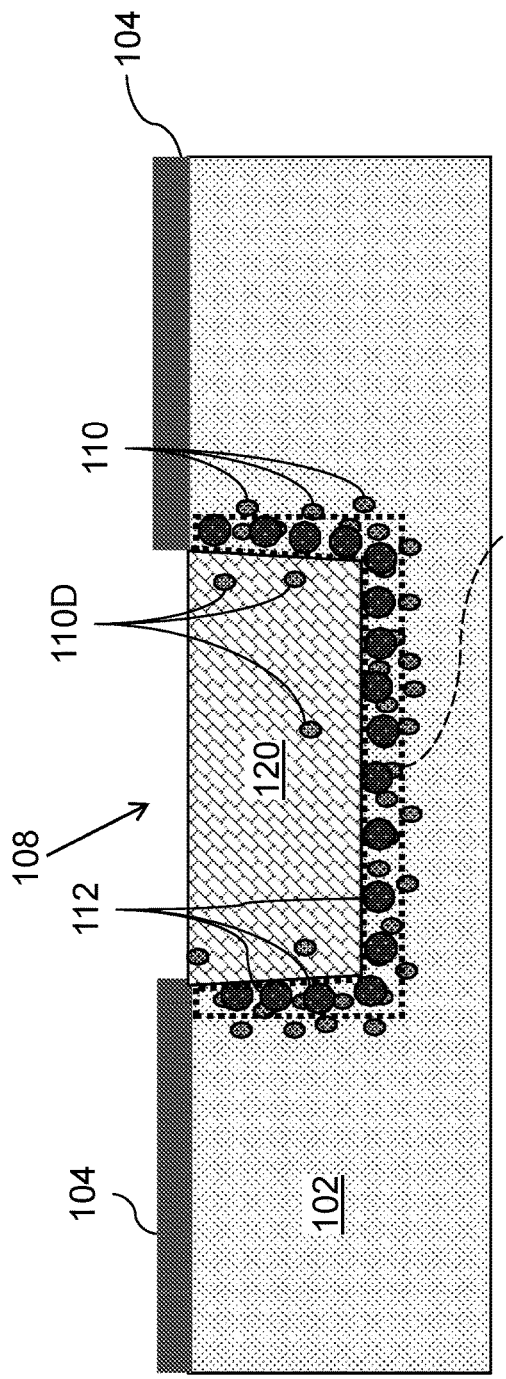

As shown in FIG. 2G, a recess etching process may be performed to vertically recess the detection region 120. In some embodiments, the vertical recess distance may be greater than the thickness of the hard mask layer 104, in order to prevent direct contact between the hard mask layer 104 and the detection region 120.

Figure 2H:
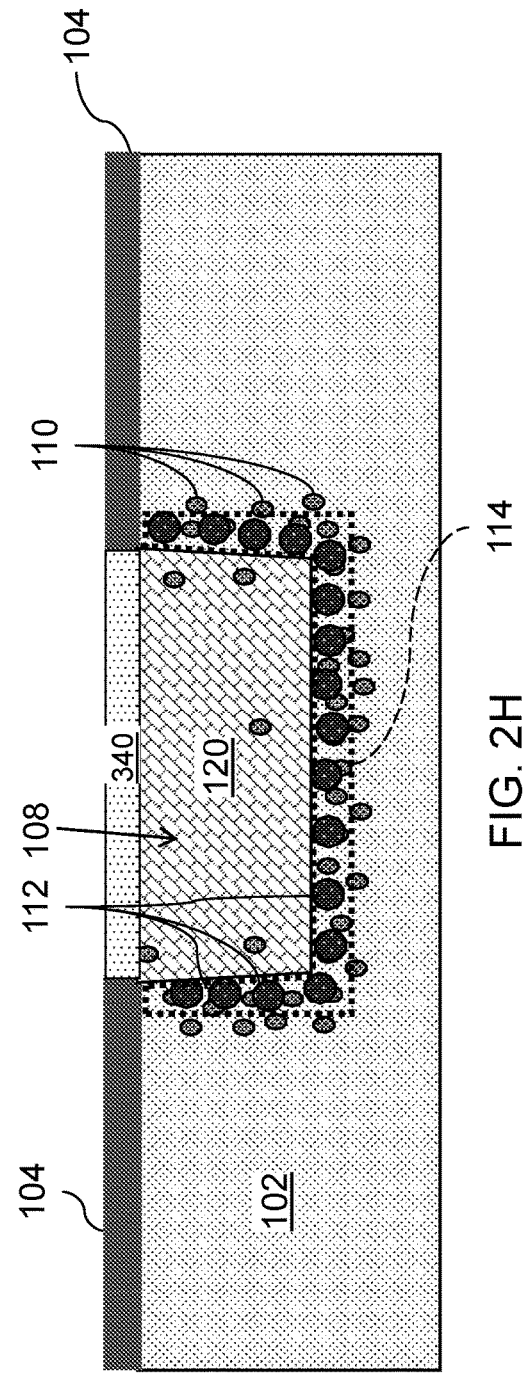

Referring to FIGS. 1 and 2H, in operation 20 a selective epitaxy process may be performed to grow a silicon passivation layer 340 from the top surface of the detection region 120. The silicon passivation layer 340 may include single crystalline silicon. Alternatively, a selective or non-selective silicon deposition process may be performed under conditions that forms polycrystalline silicon. In such embodiments, the passivation layer 340 may include, and/or may consist essentially of, polysilicon.

The silicon passivation layer 340 may include undoped silicon. As used herein, undoped silicon refers to silicon without dopants that are intentionally introduced during a deposition process. Thus, the level of electrical dopants in undoped silicon may be present at a residual level. For example, undoped silicon may be intrinsic, or may include electrical dopants at a dopant concentration less than $1.0 \times 10^{16}/cm^3$, such as from $1.0 \times 10^{12}/cm^3$ to $1.0 \times 10^{15}/cm^3$. Undoped silicon provides relatively high resistivity and may be effective in suppressing leakage current. Undoped silicon may be grown by a selective deposition process or a non-selective deposition process. In embodiments in which a non-selective deposition process is used, excess portions of the deposited undoped silicon material may be removed from above the horizontal plane including the top surface of the hard mask layer 104. Remaining portions of the deposited undoped silicon comprises a silicon passivation layer 340. The top surface of the silicon passivation layer 340 may be within the horizontal plane including the top surface of the hard mask layer 104. In embodiments in which undoped silicon is deposited using a selective deposition process, a planarization process may not be necessary. The silicon passivation layer 340 functions as a silicon-containing capping structure for the germanium-containing well.

Accordingly, an array of detection regions 120 may be formed in the semiconductor substrate 102. In some embodiments, the detection regions 120 may include materials other than germanium-containing materials for detecting different wavelengths of light. In some embodiments, a pre-cleaning process may be performed to clean the recesses 108 with Hydrogen Fluoride (HF) or other suitable solution, prior to forming the detection region 120. Other suitable pre-clean solutions are within the contemplated scope of disclosure.

Referring to FIGS. 1 and 2I, in operation 22, dopants may be implanted into the silicon passivation layer 340 and the detection region 120. For convenience of illustration, the first halogen species 110, the second halogen species 112, and the diffused first halogen species 110D are not shown in FIGS. 2I-2K. Dopants of a first conductivity type may be implanted into a portion of the silicon passivation layer 340 and an upper portion of the detection region 120, using a first masked ion implantation process. The implanted portion of the silicon passivation layer 340 comprises a first-conductivity-type silicon region 341, and the implanted portion of the detection region 120 comprises a first-conductivity-type germanium-containing region 301. The first-conductivity-type silicon region 341 and the first-conductivity-type germanium-containing region 301 may be heavily doped. For example, each of the first-conductivity-type silicon region 341 and the first-conductivity-type germanium-containing region 301 may include electrical dopants of the first conductivity type at an atomic concentration in a range from $1.0 \times 10^{19}/cm^3$ to $2.0 \times 10^{21}/cm^3$.

Dopants of a second conductivity type may be implanted into another portion of the silicon passivation layer 340 and another upper portion of the detection region 120 using a second masked ion implantation process. The implanted portion of the silicon passivation layer 340 comprises a second-conductivity-type silicon region 342, and the implanted portion of the detection region 120 comprises a second-conductivity-type germanium-containing region 302. The second-conductivity-type silicon region 342 and the second-conductivity-type germanium-containing region 302 may be heavily doped. For example, each of the second-conductivity-type silicon region 342 and the second-conductivity-type germanium-containing region 302 may include electrical dopants of the second conductivity type at an atomic concentration in a range from $1.0 \times 10^{19}/cm^3$ to $2.0 \times 10^{21}/cm^3$.

The remaining portion of the silicon passivation layer 340 may provide lateral isolation between the first-conductivity-type silicon region 341 and the second-conductivity-type silicon region 342. The un-implanted portion of the detection region 120 is herein referred to as an intermediate germanium-containing region 308. The intermediate germanium-containing region 308 may be intrinsic or may have a doping with an atomic concentration of dopants in a range from $1.0 \times 10^{13}/cm^3$ to $1.0 \times 10^{18}/cm^3$. The intermediate germanium-containing region 308 provides lateral spacing between the first-conductivity-type germanium-containing region 301 and the second-conductivity-type germanium-containing region 302.

Referring to FIGS. 1 and 2J, in operation 24, the hard mask layer 104 may be removed, for example, by performing an isotropic etch process such as a wet etch process, and a first interconnect structure 190 may be formed on the first semiconductor substrate 102. In particular, the first interconnect structure 190 may include first dielectric material layers 192, metal interconnect structures 80, and first bonding pads 188. The interconnect structure 190 may include through-substrate via structures 504 and insulating spacers 502 that laterally surround the through-substrate via structures 504 may be formed over the semiconductor substrate 102.

Figure 2K:
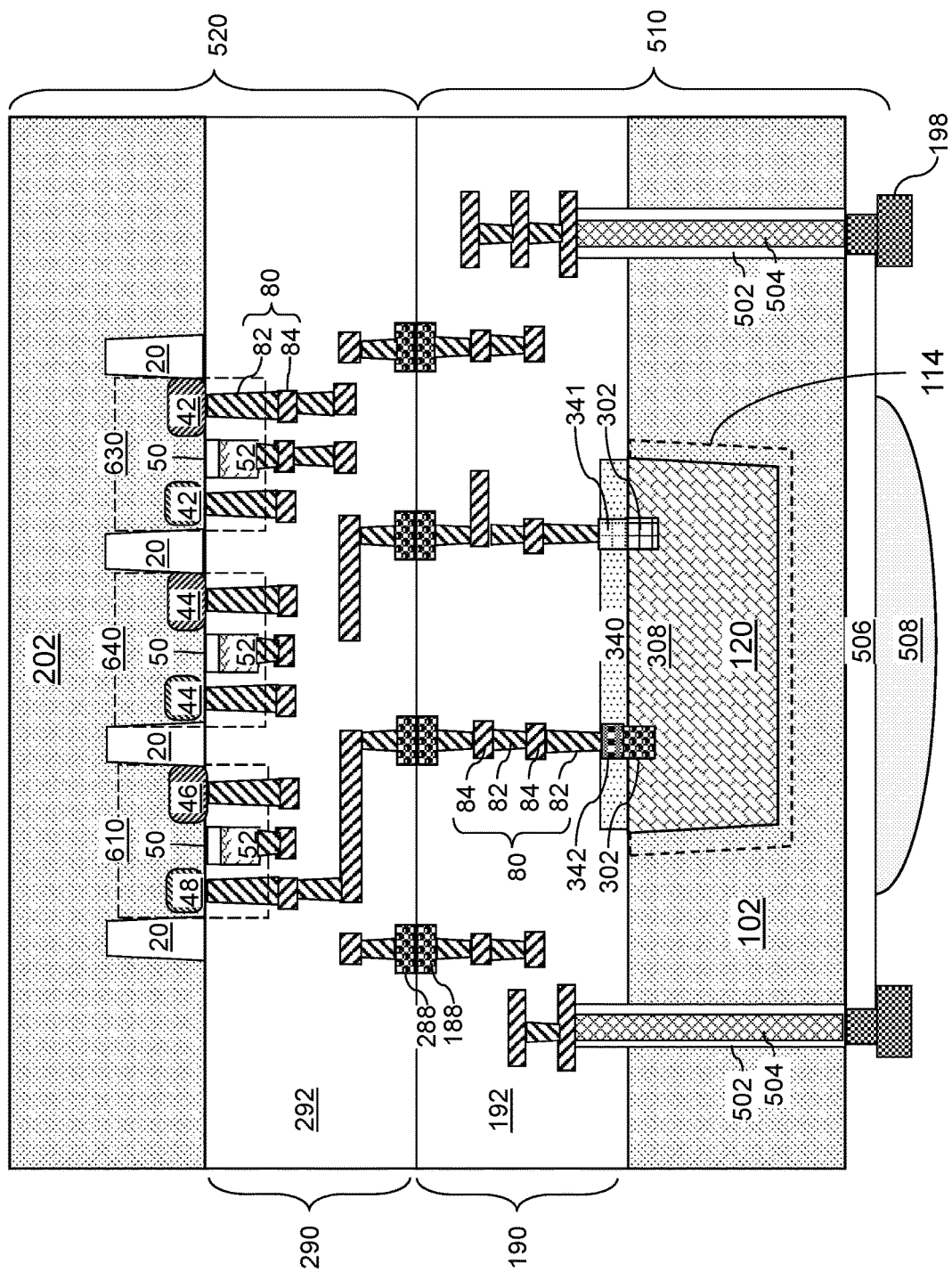

Referring to FIGS. 1 and 2K, in operation 26, an array of photodetector sensing circuits may be formed. For example, various field effect transistors (610, 630, 640) may be formed in the second semiconductor substrate 202. For example, a transfer transistor 610, p-type field effect transistors 630, and n-type field effect transistors 640 may be formed on the second semiconductor substrate 202. In the alternative, sensing circuits may be formed on the first semiconductor substrate 102.

Each of the field effect transistors (610, 630, 640) may include a respective gate dielectric 50, a respective gate electrode 52, a respective gate dielectric 50, a respective gate electrode 52, and a respective pair of a source region and a drain region. The source regions and the drain regions are collectively referred to as source/drain regions. For example, the p-type field effect transistors 630 may include p-doped source/drain regions 42, and the n-type field effect transistors 640 may include n-doped source/drain regions 44. The transfer transistor 610 may include a source region 48 to be electrically connected to the second-conductivity-type germanium-containing region 302, and a floating drain region 46. The second-conductivity-type germanium-containing region 302 and the floating drain region 46 may have a doping of the second conductivity type.

Shallow trench isolation structures 20 may be formed in an upper portion of the second semiconductor substrate 202. The shallow trench isolation structures 20 may include a dielectric fill material such as silicon oxide, and provide electrical isolation for the field effect transistors (610, 630, 640). While the present disclosure illustrates only two field effect transistors 630, 640, it is understood that a full set of field effect transistors for providing a sensing circuit for a subpixel may be formed in the second semiconductor substrate 202. The field effect transistors include transistors such as a reset transistor, a source follower transistor, and a select transistor. Any sensing circuit for sensing stored electrical charges in the second-conductivity-type germanium-containing region 302 may be formed.

In operation 28, a second interconnect structure 290 may be formed on the second semiconductor substrate 202. In particular, metal interconnect structures 80 may be formed within second dielectric material layers 292 to provide electrical wiring to and from the various semiconductor devices on the second semiconductor substrate 202. Second bonding pads 288 may be formed on the second interconnect structure 290.

In operation 30, a first wafer including the first semiconductor substrate 102 and the first interconnect structure 190 may be bonded to a second wafer including the second semiconductor substrate 202 and the second interconnect structure 290 by wafer-to-wafer bonding. For example, the first bonding pads 188 and be aligned to, and disposed upon, the second bonding pads 288, and metal-to-metal bonding may be induced on each mating pair of a first bonding pad 188 and a second bonding pad 288.

Subsequently, the backside of the first semiconductor substrate 102 may be thinned to physically expose top surfaces of the through-substrate via structures 504. A filter layer 506 may be formed on the backside of the first semiconductor substrate 102, and a lens layer 508 may be formed on the filter layer 506. Furthermore, the shape of the lenses of the lens layer 508 may be concave, convex, planar with surface structure, or other shapes, and should not be limited by the exemplary drawings here.

External bonding pads 198 may be formed on the through-substrate via structures 504. The bonded assembly of the first wafer and the second wafer may be diced to provide bonded semiconductor dies. Each bonded semiconductor die may include a first semiconductor die 510 including diced portions of the first semiconductor substrate 102 and the first interconnect structure 190, and a second semiconductor die 520 including diced portions of the second semiconductor substrate 202 and the second interconnect structure 290.

Figure 3:
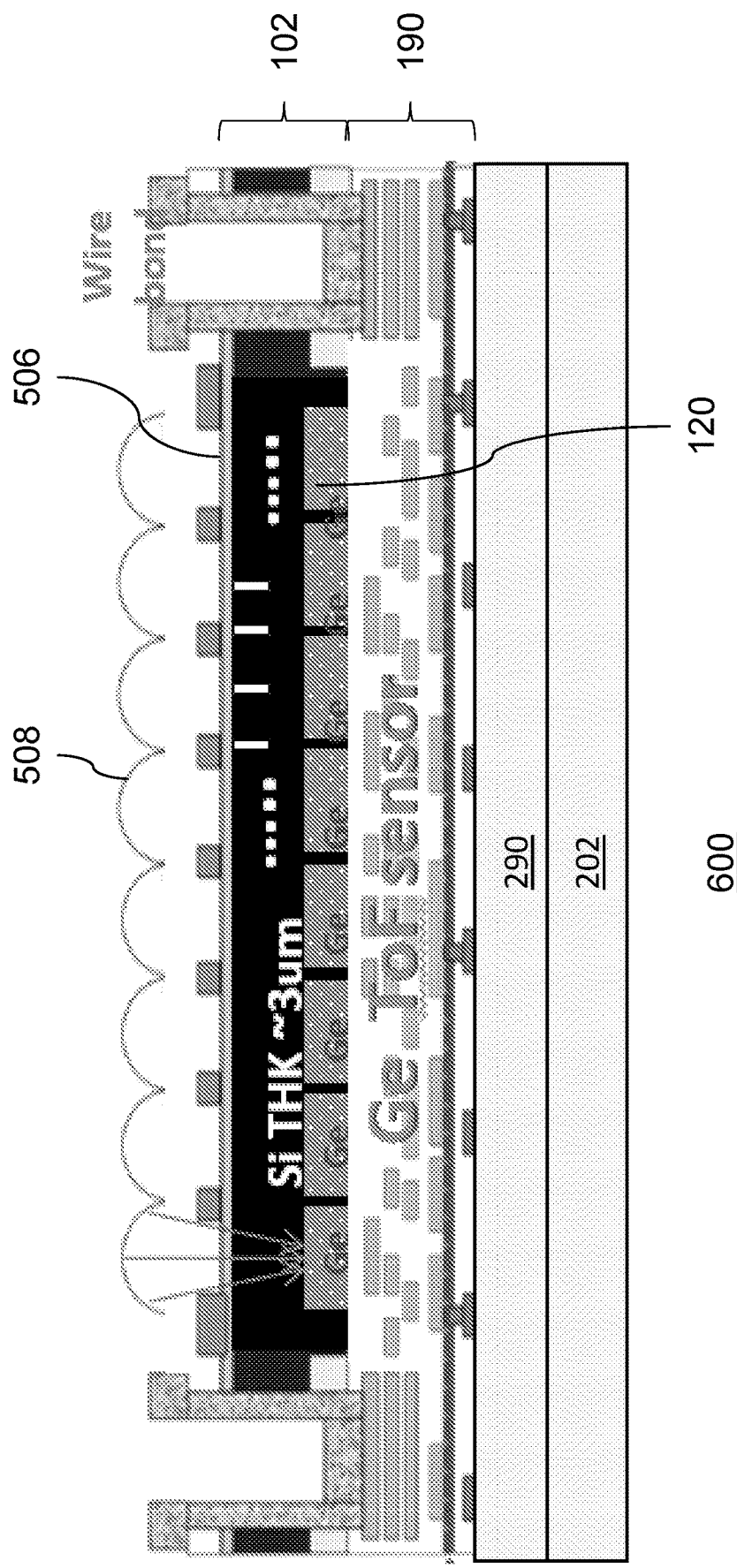
FIG. 3 is a cross-sectional view illustrating a photodetector, according to various embodiments of the present disclosure.

FIG. 3 is a cross-sectional view of a photodetector 600 according to various embodiments of the present disclosure that may be formed by bonding the first semiconductor die 510 and the second semiconductor dies 520 shown in FIG. 2K. Referring to FIGS. 2K and 3, the photodetector 600 may be a time-of-flight sensor (TOF), such as a direct time-of-flight (DToF) sensor or an indirect time-of flight (IToF) sensor.

The photodetector 600 may include a first semiconductor substrate 102, a first interconnect structure 190, a second interconnect structure 290, and a second semiconductor substrate 202, as described above. Incoming light that is to be detected by the detection regions 120 may be focused, collimated, expanded, or processed according to the lens design at the lens layer 508. The incoming detected light may then enter the filter layer 506. The filter layer 506 may be configured to pass light having a specific wavelength range. Photodiodes in the second semiconductor substrate 202 may convert the incident light into free carriers. The transistors (610, 630, 640) process free carriers received through the metal interconnect structures 80 and the bonding pads 188, 288 and process the free carriers according to the specific application.

The first semiconductor layer 102 may include photodetector sensors comprising the Ge detection regions 120. However, the first semiconductor layer 102 may include multiple groups of photodetector sensors for detecting light of different wavelength ranges. For example, a group of photodetector sensors that includes the Ge detection regions 120 may be configured to detect light of a NIR wavelength range (e.g., 810 nm to 890 nm). Although not shown, the first semiconductor layer 102 may include photodetector sensors configured to detect light of a blue wavelength range (e.g., 420 nm to 500 nm), a green wavelength range (e.g., 500 nm to 580 nm), and/or a red wavelength range (e.g., 580 nm to 660 nm). The detection regions 120 of the photodetector sensors may be isolated by insulating sidewall spacers, trenches, or other suitable isolation structures. In some implementations, the groups of photodetector sensors that are configured to detect visible light (e.g., red, green, and blue) may include silicon detection regions, (e.g., may be silicon photodetector sensors).

FIG. 4A is a graph showing halogen concentration with respect to depth in the semiconductor substrate 102 and the detection region 120 of the structure of FIG. 2H, and FIG. 4B is a cross-sectional view showing halogen concentration with respect to depth in a comparative semiconductor layer that includes a detection region and was etched using only a first halogen species.

Referring to FIGS. 2G, 4A, and 4B, since the second halogen species 112 has a larger atomic radius and/or smaller implantation depth, the second halogen species 112 forms the barrier layer 114 that reduces diffusion of the first halogen species 110 into the detection region 120. As such, only a relatively small amount of the first halogen species 110 may diffuse into the detection region 120 and as diffused halogen species 110D.

In contrast, since the comparative semiconductor substrate was not subjected to the second etching process no barrier layer was formed. As such, a relatively large amount of the first halogen species 110 can diffuse into the Ge-containing detection region formed in the comparative semiconductor layer, since the comparative semiconductor did not include a barrier layer 114 to limit such diffusion.

In particular, secondary ion mass spectrometry (SIMS) testing has shown that a peak first halogen species (e.g., Cl) atomic concentration of greater than 10 at % may occur when no barrier layer is present around a Ge layer that was grown in a recess formed using only a $Cl_2$-based reactive ion etching process. In contrast, Ge layers formed in a detection region using the present method may have a peak Cl atomic concentration of less than 10 at %, such as less than 5 at %, less than 4 at %, less than 3 at %, or less than 1 at %, based on a total at % of the Ge-containing detection region. Accordingly, the present etching process reduces halogen species diffusion, and allows for the growth of unexpectedly pure Ge regions. In this manner, an improved detection region 120 of a photodetector sensor that is less susceptible to dark current may be formed.

By etching a recess in the semiconductor substrate 102, an increased number of Ge layers may be formed over the semiconductor substrate to form a detection region 120 of the photodetector substrate. Typically, the recess 108 may be etched with a first etchant gas that contains a first halogen series 110. However, this first etchant process may result in remnants of the first halogen series 110 implanted into the bottom and side surfaces of the recess 108. These implanted first halogen series 110 particles may subsequently diffuse into the deposited Ge material of the detection region 120 and contaminate the detection region 120. By performing a second etchant process using a second etchant gas that contains a second halogen series 112, a barrier layer 114 of the second halogen series 112 may be implanted into the bottom and side surfaces of the recess 108. This barrier layer 114 may prevent and/or mitigate the diffusion of the first halogen series 110 into the subsequently deposited Ge material of the detection region 120. In particular, the first etching process and the second etching process may be performed such that a peak concentration of the second halogen species 112 in the semiconductor layer 102 occurs closer to the recess 108 than a peak concentration of the first halogen species 110 in the semiconductor layer 102. In this manner, an improved detection region 120 of a photodetector sensor that is less susceptible to dark current may be formed.

Referring to FIGS. 1-3, various embodiments provide a method of forming a semiconductor device, comprising: forming a patterned hard mask layer 104 on a semiconductor substrate 102; performing a first etching process to form a recess 108 in an exposed portion of the semiconductor substrate 102, using a first etchant comprising a first halogen species 110; performing a second etching process using a second etchant comprising a second halogen species 112, such that the second halogen species 112 forms a barrier layer 114 in the semiconductor substrate 102, surrounding the recess 108; and growing a detection region 120 in the recess 108 using an epitaxial growth process, wherein the barrier layer 114 is configured to reduce diffusion of the first halogen species 110 into the detection region 120.

In one embodiment, the first halogen species 110 may have smaller atomic radii than the second halogen species 112. In another embodiment, the first halogen species 110 may have a higher diffusion coefficient with respect to silicon than the second halogen species 112. In another embodiment, the semiconductor substrate 102 comprises Si; and the detection region 120 comprises single-crystal Ge. In another embodiment, a peak concentration of the first halogen species 110 in the detection region 120 may be less than 10 atomic percent (at %). In another embodiment, a peak concentration of the first halogen species 110 in the detection region 120 may be less than 5 atomic percent (at %). In another embodiment, the first halogen species 110 comprise F or Cl; and the second halogen species 112 comprise Br or I. In another embodiment, the second etching process may be an etching process that does not increase an etching depth of the recess 108 by more than about 10%, such as more than about 5%. In an embodiment, the first and second etching processes may comprise reactive ion etching processes. In various embodiments, the first etching process and the second etching process are performed such that a peak concentration of the second halogen species in the semiconductor substrate occurs closer to the recess than a peak concentration of the first halogen species in the semiconductor substrate.

In another embodiment, various embodiments provide for a method of forming a photodetector, including the operations of forming a patterned hard mask layer 104 on a front side of a first semiconductor substrate 102; performing a first etching process to form recesses 108 in exposed portions of the front side of the semiconductor substrate 102, using a first etchant comprising a first halogen species 110; performing a second etching process using a second etchant comprising a second halogen species 112, such that the second halogen species 112 forms barrier layers 114 in the semiconductor substrate 102, surrounding the recesses 108; and growing detection regions 120 in the recesses 108 using an epitaxial growth process. The first etching process comprises implanting the first halogen species 110 in the first silicon substrate 102 to a first depth, the second etching process comprises implanting the second halogen species 112 in the first silicon substrate 102 to a second depth that is less than the first depth, and the first halogen species 110 has a higher diffusion coefficient with respect to silicon than the second halogen species.

In an embodiment, the detection regions 120 may comprise single crystal Ge. In one embodiment, the first halogen species 110 may comprise F or Cl; and the second halogen species 112 comprise Br. In one embodiment method, the detection regions 120 may be disposed in an array on the semiconductor substrate 102. In one embodiment method, the first halogen species 110 may have a higher diffusion coefficient with respect to silicon than the second halogen species 112. In one embodiment, the first etching process comprises implanting the first halogen species 110 in the semiconductor substrate 102 to a first depth; and the second etching process comprises implanting the second halogen species 112 in the semiconductor substrate 102 to a second depth that is less than the first depth.

Various embodiments provide a photodetector 600 comprising: a first semiconductor substrate 102; detection regions 120 comprising epitaxial germanium (Ge) and disposed in recesses 108 formed in a front side of the first semiconductor substrate 102; a first halogen species 110 implanted in the first semiconductor substrate 102 around the recesses; barrier layers 114 surrounding the recesses 108 and comprising second halogen species 112, wherein the barrier layers 114 are configured to reduce diffusion of the first halogen species 110 into the detection regions 120 from the semiconductor substrate 102, wherein the first halogen species 110 has a smaller atomic radius than the second halogen species 112. In some embodiments, the photodetector 600 may also include: a second semiconductor substrate 202 comprising photodetector sensing circuits (610, 630, 640); and an interconnect structure (190, 290) electrically connecting the detection regions 120 to the photodetector sensing circuits (610, 630, 640).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a patterned hard mask layer on a semiconductor substrate;
   performing a first etching process to form a recess in an exposed portion of the semiconductor substrate, using a first etchant comprising a first halogen species;
   performing a second etching process using a second etchant comprising a second halogen species, such that the second halogen species forms a barrier layer in the semiconductor substrate, surrounding the recess; and
   growing a detection region in the recess using an epitaxial growth process,
   wherein the barrier layer is configured to reduce diffusion of the first halogen species into the detection region.

2. The method of claim 1, wherein the first halogen species has a smaller atomic radius than the second halogen species.

3. The method of claim 1, wherein the first halogen species has a higher diffusion coefficient with respect to silicon than the second halogen species.

4. The method of claim 1, wherein:
the semiconductor substrate comprises silicon (Si); and
the detection region comprises single-crystal germanium (Ge).

5. The method of claim 1, wherein a peak concentration of the first halogen species in the detection region is less than 10 atomic percent (at %).

6. The method of claim 1, wherein a peak concentration of the first halogen species in the detection region is less than 5 atomic percent (at %).

7. The method of claim 1, wherein:
the first halogen species comprises fluorine (F) or chlorine (Cl); and
the second halogen species comprises bromine (Br).

8. The method of claim 1, wherein:
the first halogen species comprises fluorine (F) or chlorine (Cl); and
the second atomic species comprises iodine (I).

9. The method of claim 1, wherein the first etching process and the second etching process are performed such that a peak concentration of the second halogen species in the semiconductor substrate occurs closer to the recess than a peak concentration of the first halogen species in the semiconductor substrate.

10. The method of claim 1, wherein the second etching process is an etching process that does not increase an etching depth of the recess by more than 5%.

11. The method of claim 1, wherein the first etching process and the second etching process comprise reactive ion etching processes.

12. The method of claim 11, wherein the first etching process comprises applying a higher bias voltage than the second etching process.

13. A method of forming a photodetector, comprising:
forming a patterned hard mask layer on a front side of a first semiconductor substrate;
performing a first etching process to form recesses in exposed portions of the front side of the first semiconductor substrate, using a first etchant comprising a first halogen species;
performing a second etching process using a second etchant comprising a second halogen species, such that the second halogen species forms barrier layers in the first semiconductor substrate, surrounding the recesses;
growing detection regions comprising single-crystal germanium (Ge) in the recesses using an epitaxial growth process;
forming a passivation layer on the detection regions;
forming a first interconnect structure over the front surface of the first semiconductor substrate;
forming a second interconnect structure on a second semiconductor substrate, the second semiconductor substrate comprising photodetector sensing circuits; and
bonding the first interconnect structure and the second interconnect structure, wherein,
the first etching process comprises implanting the first halogen species in the first semiconductor substrate to a first depth,
the second etching process comprises implanting the second halogen species in the first semiconductor substrate to a second depth that is less than the first depth, and
the first halogen species has a higher diffusion coefficient with respect to silicon than the second halogen species.

14. The method of claim 13, wherein:
the first halogen species comprise fluorine (F) or chlorine (Cl); and
the second halogen species comprise bromine (Br) or iodine (I).

15. The method of claim 13, further comprising:
forming through-substrate via structures in the first semiconductor substrate;
thinning a backside of the first semiconductor substrate to expose the through-substrate via structures;
forming external bonding pads on exposed portions of the through-substrate via structures;
forming a filter layer on the backside of the first semiconductor substrate; and
forming a lens layer on the filter layer.

16. A photodetector comprising:
a first semiconductor substrate;
detection regions comprising epitaxial germanium (Ge) and disposed in recesses formed in a front side surface of the first semiconductor substrate;
a first halogen species implanted in the first semiconductor substrate around the recesses; and
barrier layers surrounding the recesses and comprising a second halogen species, wherein the barrier layers are configured to reduce diffusion of the first halogen species into the detection regions from the first semiconductor substrate,
wherein the first halogen species has a smaller atomic radius than the second halogen species.

17. The photodetector of claim 16, further comprising:
a second semiconductor substrate comprising photodetector sensing circuits; and
an interconnect structure electrically connecting the detection regions to the photodetector sensing circuits.

18. The photodetector of claim 16, wherein a peak concentration of the second halogen species in the first semiconductor substrate occurs closer to each recess than a peak concentration of the first halogen species in the semiconductor substrate.

19. The photodetector of claim 16, wherein:
the first halogen species comprise fluorine (F) or chlorine (Cl); and
the second halogen species comprise bromine (Br) or iodine (I).

20. The photodetector of claim 16, wherein the first halogen species is implanted at a greater depth in the first semiconductor substrate than the second halogen species.

* * * * *